United States Patent

Kobayashi

[11] Patent Number: 6,064,868
[45] Date of Patent: May 16, 2000

[54] ANTENNA TUNING CONTROLLER

[76] Inventor: Yasuhiro Kobayashi, c/o NEC Corporation, 7-1, Shiba 5-chome, Minato-ku, Tokyo, Japan

[21] Appl. No.: 08/698,440

[22] Filed: Aug. 19, 1996

[30] Foreign Application Priority Data

Aug. 24, 1995  [JP]  Japan .................................. 7-215552

[51] Int. Cl.⁷ ............................. H04B 1/18; H04B 17/00
[52] U.S. Cl. ................... 455/193.1; 455/280; 455/226.2
[58] Field of Search ................................. 455/280, 269, 455/193.1, 226.1, 226.2, 120, 121, 123, 38.3, 343

[56] References Cited

U.S. PATENT DOCUMENTS

| | | | |
|---|---|---|---|
| 4,862,516 | 8/1989 | Macnak et al. | 455/193 |
| 5,252,963 | 10/1993 | Snowden et al. | 340/825.44 |
| 5,369,799 | 11/1994 | Tsunoda | 455/38.3 |
| 5,410,734 | 4/1995 | Choi et al. | 455/38.3 |
| 5,483,688 | 1/1996 | English et al. | 455/184.1 |
| 5,493,698 | 2/1996 | Suzuki et al. | 455/72 |
| 5,638,054 | 6/1997 | Davis et al. | 340/825.44 |

FOREIGN PATENT DOCUMENTS

| | | |
|---|---|---|
| 50918 | 5/1982 | European Pat. Off. . |
| 261935 | 3/1988 | European Pat. Off. . |
| 4-48827 | 2/1992 | Japan . |
| 4-150421 | 5/1992 | Japan . |
| 88 05214 | 7/1988 | WIPO . |

*Primary Examiner*—Douglas W. Olms
*Assistant Examiner*—David R. Vincent
*Attorney, Agent, or Firm*—Ostrolenk, Faber, Gerb & Soffen, LLP

[57] ABSTRACT

When mixed modulation signal may be erroneously determined to be a signal intended to be received by a particular receiver the receiver checks whether prevailing received signal is a signal intended to be received by that receiver. When the received signal intended is other than a signal to be received, by that receiver the receiver turns off an antenna tuner to prevent impedance matching between the antenna side impedance and the radio section side impedance. When the received signal intended is a signal to be received, by that receiver the receiver turns on the antenna tuner to allow impedance matching between the two impedances.

13 Claims, 3 Drawing Sheets

ANTENNA TUNING CONTROLLER

BACKGROUND OF THE INVENTION

The present invention relates to an antenna tuning controller and, more particularly, to an antenna tuning controller for tuning an antenna by taking impedance matching between the antenna and a radio section.

A prior art radio equipment has an antenna tuner which optimizes a reception sensitivity at a reception frequency. The antenna tuner is provided between the antenna and a radio section for amplifying and frequency converting the received signals. The antenna tuner includes a variable capacitor, the capacitance of which is adjusted in the manufacture of the radio equipment.

However, whenever the reception frequency is changed or it is necessary to cope with a plurality of reception frequencies, the capacitance adjustment should be made to optimize the reception sensitivity. Japanese Laid-Open Patent Publication No. 4-150421 discloses a radio selective call receiver, in which the capacitance of a variable capacitor in an antenna tuner is varied according to a signal representing the level or amplitude of the received signal. In this receiver, a change in the capacitance of the antenna tuner variable capacitor causes a change in its internal impedance, according to which the antenna side impedance and the radio section side impedance are matched, thus causing the radio section output signal level to change. Accordingly, in this receiver the antenna tuner is controlled so as to always provide a high radio section output signal level, i.e., provide for impedance matching between the antenna side impedance and the radio section side impedance, at the selected reception frequency.

However, in the disclosed receiver the antenna tuner is controlled according to the received signal level. This means that when a mixed modulation signal is produced by signals which are not to be received, the antenna tuner impedance is nevertheless controlled according to the level of the mixed modulation. For example, near the base station the electric field intensity of the mixed modulation of signals other than the signal to be received is increased. If the electric field intensity of the mixed modulation of signals exceeds a predetermined value, the impedance of the antenna tuner is controlled so as to increase the level of the mixed modulation signal even though the receiver is not receiving a signal designated for that receiver.

When the user carrying the receiver is moved away from the base station neighborhood and the receiver receives the signal to be received in place of the mixed modulation signal, the antenna side impedance is suddenly changed due to a great frequency difference between the two signals. At the time of the sudden change in the antenna side impedance, the radio section side impedance is not changed, thus giving rise to erroneous impedance matching between the two impedances. Although the antenna tuner impedance is controlled according to the level of the received signal, a certain time is taken until the impedance matching between the antenna and the radio section is obtained afresh because of the sudden change in the antenna side impedance. A time is thus required until reaching of an increased level of the signal to be received. During this time, the received signal may fail to be decoded accurately. Particularly, the receiver fails to receive the own call number that may be transmitted from the base station during this time. In this case, the receiver can not inform the call, and its carrier can not recognize the call.

SUMMARY OF THE INVENTION

An object of the present invention is therefore to provide an antenna tuner, which can solve the above problem inherent in the prior art and stop an antenna tuner impedance control upon reception of a signal not to be received, for instance, mixed modulation of signals other than the signal to be received.

According to one aspect of the present invention, there is provided an antenna tuning controller comprising: an antenna for receiving a radio signal and outputting the received signal; a radio section for amplifying the received signal; an antenna tuner means connected to the antenna and also to the radio section and for matching the antenna side impedance and the radio section side impedance according to its own impedance variation with an electric intensity signal; an electric field intensity detecting means for detecting the electric field intensity of the amplified received signal from the radio section and outputting the electric field intensity signal representing the detected electric field intensity; and a control means for checking whether the amplified received signal from the radio section is a signal to be received by the radio receiver, and turning off the electric field intensity detecting means when the amplified received signal is not a signal to be received.

The control means includes a demodulating means for demodulating the amplified received signal from the radio section and outputting the resultant demodulation signal, a detecting means for detecting, from the demodulation signal, a sync signal contained in the signal to be received by the radio receiver, and outputting a detection signal upon detection thereof and a turn-off control means for turning off the electric field intensity detecting means when no detection signal is inputted.

The control means includes a first memory means for storing a first predetermined value for checking whether impedance matching between the antenna side impedance and the radio section side impedance is present, a second memory means for storing a second predetermined value for permitting detection of the sync signal from the demodulation signal in the absence of impedance matching between the antenna side impedance and the radio section side impedance and a commanding means for comparing the electric field intensity represented by the electric field intensity signal and the first predetermined value, comparing the electric field intensity represented by the electric field intensity signal and the second predetermined value when the electric field intensity represented by the electric field intensity signal is less than the first predetermined value, and commanding the detecting means to detect the sync signal from the demodulation signal when the electric field intensity represented by the electric field intensity signal is no less than the second predetermined value.

The electric field intensity detecting means outputs the electric field intensity signal by converting a voltage proportional to the amplitude of the amplified received signal into the electric field intensity.

The antenna tuning means includes a variable capacitance capacitor having one terminal connected to the antenna and grounded at the other terminal, a variable voltage capacitor having one terminal connected to one terminal of the variable capacitance capacitor and grounded at the other terminal, connected a capacitor having one terminal to one terminal of the variable voltage capacitor and the other terminal connected to the radio section and a resistor having one terminal connected to one terminal of the variable voltage capacitor and the other terminal connected to the electric field intensity detecting means.

The antenna tuning controller further comprises: a timer for starting measurement of a predetermined time when the electric field intensity detecting means is turned off by the control means and outputting a time-up signal upon occurrence of the time-up of the time measurement; and a turn-on control means for turning on the electric field intensity detecting means in response to the time-up signal.

The antenna tuning controller further comprises: a turn-on control means for turning on the electric field intensity detecting means upon input of the detection signal after the electric field intensity detecting means has been turned off by the turn-off control means.

According to another aspect of the present invention, there is provided an antenna tuning controller comprising: an antenna for receiving a radio signal and outputting the received signal; a radio section for amplifying the received signal; an antenna tuning means connected to the antenna and also to the radio section and for impedance matching between the antenna side impedance and the radio section side impedance with impedance variation according to an electric field intensity signal; electric field intensity detecting means for detecting the electric field intensity of the amplified received signal from the radio section and outputting the electric field intensity signal representing the detected electric field intensity to the antenna tuner means; and control means for checking whether the amplified received signal from the radio section is a signal to be received by the radio receiver, and tentatively stopping the input of the electric field intensity signal to the antenna tuner means when the amplified received signal is other than a signal to be received by the receiver.

According to another aspect of the present invention, there is provided an antenna tuning controller comprising: antenna means for receiving radio signal and outputting the received signal; radio section means for amplifying the received signal; and a control means for preventing impedance matching between the antenna side impedance and the radio section side impedance when the received signal is other than a signal to be received, by the receiver and for executing the impedance matching when the received by the receiver signal is a signal to be received. With the above construction according to the present invention, upon reception of a signal not to be received, the electric field intensity detecting means is turned off to prohibit the antenna tuner impedance control, thus avoiding the tuning of the antenna to a signal not to be received.

Other objects and features will clarified from the following description with reference to attached drawings.

DETAILED DESCRIPTION OF THE PREFERRED EMBODIMENT

Preferred embodiments of the present invention will now be described with reference to the drawings.

Figure 1:
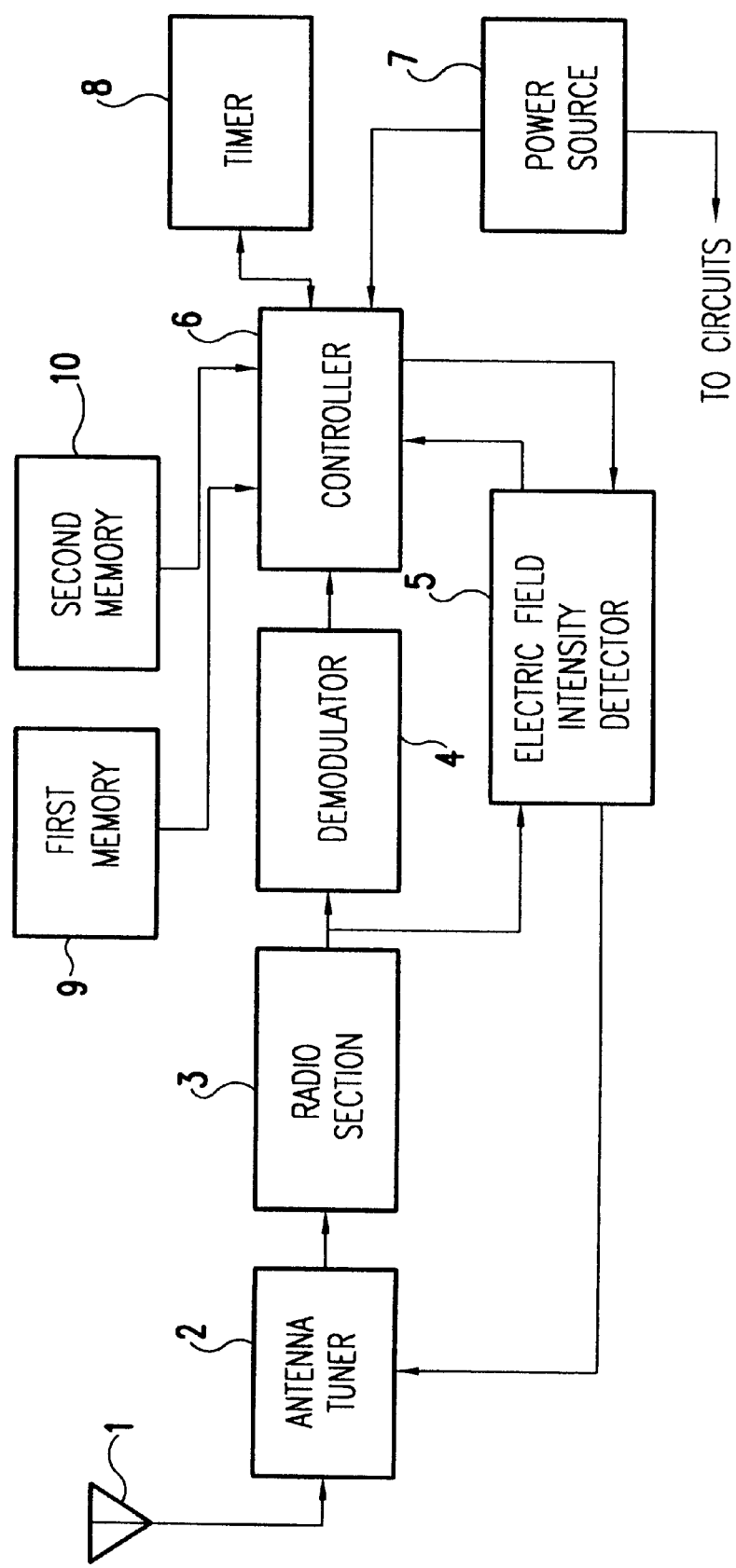
FIG. 1 is a block diagram showing an embodiment of the antenna tuning controller according to the present invention.

FIG. 1 is a block diagram showing an embodiment of the antenna tuner according to the present invention. Referring to the Figure, an antenna 1 receives a radio signal from a base station (not shown) and outputs the received signal to an antenna tuner 2. In the antenna tuner 2, the impedance thereof is controlled according to the electric field intensity represented by an electric field intensity signal from an electric field intensity detector 5, whereby the resultant impedance of this impedance in combination with the antenna side impedance is varied for impedance matching with respect to the radio section side impedance. A radio section 3 amplifies and converts the received signal inputted through the antenna tuner 2 and outputs the resultant signal to a controller 6.

A demodulator 4 demodulates the received signal from the radio section 3 and outputs the resultant demodulation signal to the controller 6. The electric field intensity detector 5 detects the electric field intensity of the received signal from the radio section 3 and outputs the resultant electric field intensity signal to the antenna tuner 2 and also to the controller 6. The electric field intensity detector 5 detects the electric field intensity by detecting the amplitude of the radio signal which is an AC signal, and a DC voltage which is proportional to the detected amplitude is outputted as the electric field intensity represented by the electric field intensity signal. The electric field intensity detector 5 is on-off controlled according to a control signal from the controller 6.

In a first memory 9 is stored a first predetermined value for checking whether the antenna 1 and the radio section 3 have been impedance matched. The stored first value is outputted from the first memory 9 to the controller 6 in response to an instruction from the controller 6.

In a second memory 10 is stored a second predetermined value for checking whether the controller 6 can decode the demodulation signal from the demodulator 4 when the antenna 1 and the radio section 2 have not been impedance matched. The stored second value is outputted from the second memory 10 to the controller 6 in response to an instruction from the controller 6. The second value corresponds to a threshold for discrimination between the noise and signal to be received. When the electric field intensity of mixed modulation signal is above the second value, it may be erroneously determined by the controller 6 as a signal to be received.

The controller 6 turns on the electric field intensity detector 5 when a power source 7 is turned on. The controller 6 checks whether the impedance matching between the antenna 1 and the radio section 3 has been made through comparison of the electric field intensity represented by the electric field intensity signal from the electric field intensity detector 5 and the first predetermined value from the first memory 9. When the impedance matching between the antenna 1 and the radio section 3 has not been made, the controller 6 compares the electric field intensity represented by the electric field intensity signal and the second predetermined value. When the electric field intensity represented by the electric field intensity signal is above the second predetermined value, the controller 6 checks whether the radio signal received by the antenna 1 is a signal to be received by the receiver. This check is done through detection of a sync signal from the demodulation signal, for instance. In the absence of the detected sync signal, the controller 6 outputs a control signal to the electric field intensity detector 5 to turn off the detector 5. After turning off the electric field intensity detector 6, the controller 6 sets a timer 8 to a predetermined time. When a time-up signal from the timer 8 is inputted to it, the controller 6 outputs a control signal to the electric field intensity detector 5 to turn on the detector 5.

The timer 8 is set to the predetermined time by the controller 6 and, upon time-up, outputs a time-up signal to the controller 6. The power source 7 supplies the power to the controller 6 and various other circuits.

Figure 2:
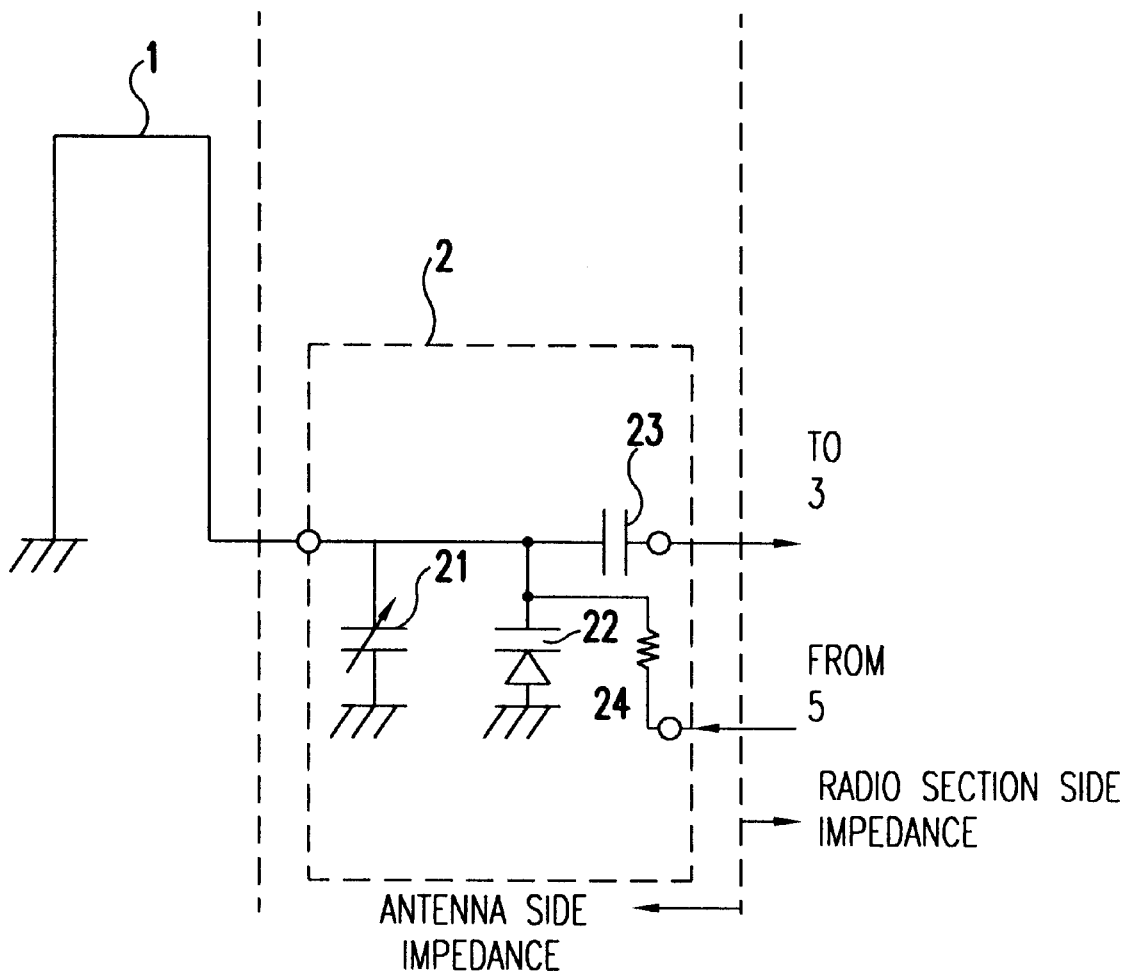
FIG. 2 is a block diagram of the antenna tuner 2 in FIG. 1.

The antenna tuner shown in FIG. 1 will now be described with reference to the circuit diagram of FIG. 2. Referring to the Figure, the antenna tuner 2 includes a variable capacitance capacitor 21, a variable voltage capacitor 22, a capacitor 23, and a resistor 24. The variable capacitance capacitor 21 is connected at one terminal to the antenna 1 and grounded at the other terminal. The variable voltage capacitor 22 is connected at one terminal to one terminal of the variable capacitance capacitor 21 and grounded at the other terminal. The variable voltage capacitor is further connected at one terminal to one terminal of the capacitor 23 and also to one terminal of the resistor 24. The capacitor 23 has its other terminal connected to the radio section 3, and the resistor 24 has its other terminal connected to the electric field intensity detector 5.

Upon input of the electric field intensity signal from the electric intensity detector 5 to the antenna tuner 2, the electric intensity signal is inputted to the voltage variable capacitor 22. In the variable voltage capacitor 22, the electrostatic capacitance is varied according to the electric field intensity represented by the electric field intensity signal, i.e., a DC voltage. The variation of the electrostatic capacitance of the variable voltage capacitor 22 varies the impedance of the antenna tuner 2 to vary the resultant impedance of the combination of the antenna side impedance and the impedance of the antenna tuner 2, thus effecting impedance matching with respect to the radio section side impedance.

The operation of the antenna tuning control in the antenna tuning controller according to the present invention will now be described with reference to the flow chart of FIG. 3.

Figure 3:
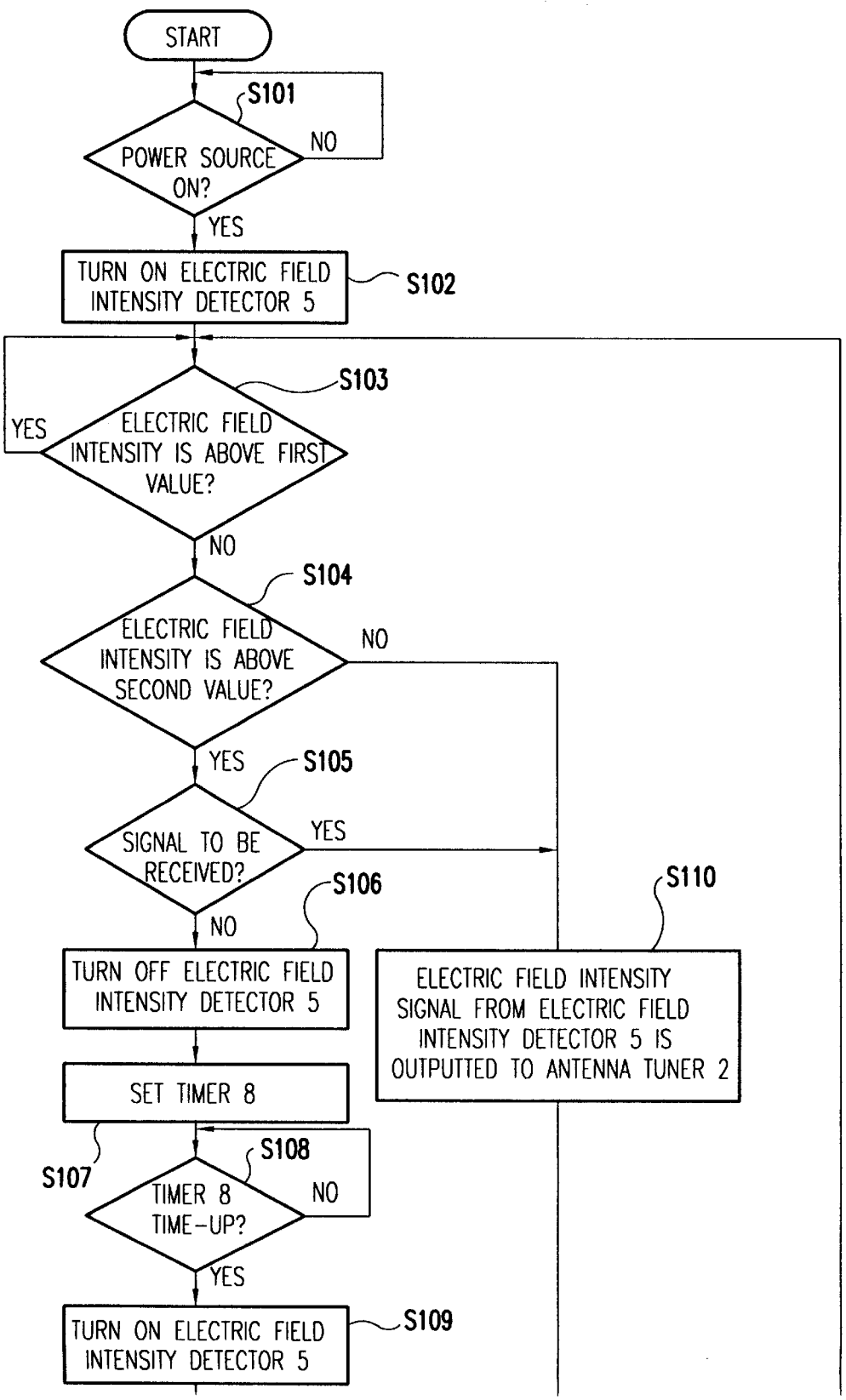
FIG. 3 is a flow chart showing the operation of the antenna tuning control in the antenna tuning controller according to the present invention.

Referring to FIG. 3, the controller 6 first checks whether the power source 7 has been turned on (Step 101). When the check reveals that the power source 7 has not been turned on, the routine goes back to the step S101. When the power source 7 has been turned on, the controller 6 outputs a control signal to the electric field intensity detector 5 to turn on the detector 5 (Step 102).

After turning on the electric field intensity detector 5, the controller 6 checks whether the electric field intensity represented by the electric field intensity signal from the electric field intensity detector 5 is above the first predetermined value stored in the first memory 9 through comparison of the represented electric field intensity and the first predetermined value (Step 103). When this check proves that the represented electric field intensity is above the first predetermined value, the controller 6 determines that the impedance matching between the antenna and the radio section has been obtained, and the routine goes back to the step S102.

When the electric field intensity represented by the electric field intensity signal is not above the first predetermined value, the controller 6 determines that no impedance matching between the antenna and the radio section has been obtained, and checks whether the represented electric field intensity is above the second predetermined value stored in the second memory 10 through comparison of the represented electric field intensity and the second predetermined value (Step S104).

When the check proves that the represented electric field intensity is not above the second predetermined value, the controller 6 determines that demodulation signal from a demodulator 4 can not be decoded at all, and the routine goes to a step S110 to be described later. When the represented electric field intensity is above the second predetermined value, the controller 6 determines that the demodulation signal from the demodulator 4 can be decoded, and checks whether the demodulation signal is obtained from mixed modulation or from a signal to be received by that receiver (Step S105). The check in the step S105 is done through a check whether sync signal can be detected from the demodulation signal. When the sync signal is detected, the controller 6 determines that the demodulation signal is obtained from a signal to be received, and the routine goes to the step S110 to be described later.

When no sync signal is detected, the controller 6 determines that the demodulation signal is obtained from the mixed modulation signal, and outputs a control signal to the electric field intensity detector 5 to turn off the detector 5 (Step S106). By turning off the electric field intensity detector 5, the control of the impedance of the antenna tuner 2 according to mixed modulation is prevented.

After turning off the electric field intensity detector 5, the controller 6 sets the timer 8 to a predetermined time (Step S107), and checks for the time-up of the timer 8 (Step S108). The predetermined time which the timer 8 is set to, is one thought to be needed for the receiver carrier to move away from the base station or like high electric field intensity field locality until the electric field intensity is not above the second predetermined value. In other words, the time corresponds to one, during which a distance from the base station is covered to such an extent that the receiver no longer erroneously takes the mixed modulation signal as the signal to be received.

Upon time-up of the timer 8, the controller 6 determines that the receiver carrier is distant from a position of high intensity of the electric field from the base station or the like so that there is no possibility of erroneous determination of mixed modulation signal as the signal to be received by the receiver, and outputs a control signal to the electric field intensity detector 5 to turn on the same again (Step S109).

When it is determined in the step S104 that the electric field intensity represented by the electric field intensity signal is less than the first predetermined value, and when it is determined in this step S105 that the demodulation signal has been obtained from the signal to be received by that receiver, the electric field intensity signal from the electric field intensity detector 5 is outputted to the antenna tuner 2 (Step S110). According to the electric field intensity represented by the electric field intensity signal, the impedance of the antenna tuner 2 is varied to vary the combination impedance of the antenna side impedance and the impedance of the antenna tuner 2, so that the electric field intensity detected by the electric field intensity detector 5 is varied. The above operation is continued until it is determined by the controller 6 that the detected electric field intensity is above the first predetermined value stored in the first memory 9. When the detected electric field intensity exceeds the first predetermined value, the controller 6 determines that the antenna side impedance and the radio section side impedance have been matched with each other.

In the above embodiment, the electric field intensity detector 5 is turned off by the controller 6 when the mixed modulation signal is received by the receiver, that is, in case of failure of the sync signal detection from the demodulation signal. Instead of turning off the electric field intensity detector 5, however, it is possible to turn off the input of the electric field intensity signal from the electric field intensity detector 5 to the antenna tuner 2. In this case, the electric field intensity signal from the electric field intensity detector 5 is inputted to the controller 6. Thus, when the electric field intensity represented by the electric field intensity signal exceeds the second predetermined value, the controller 6 turns on the input of the electric field intensity signal to the antenna tuner 2 to provide for impedance matching until it is possible to detect the sync signal.

It is further possible to arrange such that upon detection of the sync signal from the demodulation signal, the controller 6 turns on the electric field intensity detector 5 for impedance matching while the time-up of the timer 8 has not yet been produced.

Moreover, while in the above embodiment the first and second predetermined values are stored in the first and second memories, respectively, it is possible to store the two values in a single memory.

As has been described in the foregoing, in the antenna tuning controller according to the present invention, the antenna tuner is held "off" while the receiver is receiving the mixed modulation signal, thus eliminating the possibility of impedance matching between the antenna side impedance and the radio section side impedance according to the mixed modulation signal. Thus, when the receiver receives a signal to be received by that receiver rather than a mixed modulation signal, the impedance matching between the antenna side impedance and the radio section side impedance can be obtained in a short period of time.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. An antenna tuning controller comprising:
    an antenna for receiving a radio signal and outputting the received signal;
    a radio section for amplifying the received signal;
    an antenna tuner connected to the antenna and to the radio section and for matching the antenna side impedance with the radio section side impedance by varying the antenna tuner impedance according to an electric field intensity signal;
    an electric field intensity detector for detecting the electric field intensity of the amplified received signal from the radio section and outputting the electric field intensity signal representing the detected electric field intensity; and
    a controller for evaluating the electric field intensity represented by the electric field intensity signal and, in response to a particular evaluation result, determining whether the amplified signal received from the radio section is intended to be received by a particular receiver, and for controlling the matching of the antenna side impedance with the radio section side impedance upon a determination that the amplified received signal is not intended to be received.

2. The antenna tuning controller according to claim 1, wherein the controller includes:
    a demodulator for demodulating the amplified signal received from the radio section and outputting resultant demodulation signal;
    A sync signal detector for detecting, from the demodulation signal, a sync signal contained in the received signal, and outputting a detection signal in response to a detection thereof; and
    a turn-off controller for turning off the electric field intensity detector when no detection signal is outputted from the sync signal detector.

3. The antenna controller according to claim 2, wherein the controller further includes:
    a first memory for storing a first predetermined value representing a threshold level above which indicates that the antenna side impedance and the radio section side impedance have been matched;
    a second memory for storing a second predetermined value representing a threshold level above which indicates that the demodulation signal of the received signal may be decodable; and
    a commanding means for evaluating whether the electric field intensity represented by the electric field intensity signal is within the predetermined range by comparing the electric field intensity with the first predetermined value, comparing the electric field intensity represented by the electric field intensity signal with the second predetermined value when the electric field intensity represented by the electric field intensity signal is determined to be less than the first predetermined value, and commanding the sync signal detector to detect the sync signal from the demodulation signal when the electric field intensity represented by the electric field intensity signal is determined to be less than the first predetermined value but not less than the second predetermined value.

4. The antenna tuning controller according to claim 1, wherein the electric field intensity detector outputs the electric field intensity signal by converting a voltage proportional to the amplitude of the amplified received signal into the electric field intensity.

5. The antenna tuning controller according to claim 1, wherein the antenna tuner includes:
    a variable capacitance capacitor (VCC) having a first VCC terminal connected to the antenna and a second VCC terminal connected to ground;
    a variable voltage capacitor (VVC) having a first VVC terminal connected to one of the first and second VCC terminals and a second VVC terminal connected to ground;
    a capacitor (CP) having a first CP terminal connected to one of the first and second VVC terminals and a second CP terminal connected to the radio section; and
    a resistor (RS) having a first RS terminal connected to one of the first and second VVC terminals and a second RS terminal connected to the electric field intensity detector.

6. The antenna tuning controller according to claim 2, which further comprises:
    a timer for starting a time measurement when the electric field intensity detector is turned off by the controller and outputting a time-up signal when the time measurement reaches a predetermined time interval; and
    a turn-on controller for turning on the electric field intensity detector in response to the time-up signal.

7. The antenna tuning controller according to claim 2, further comprising:
    a turn-on controller for turning on the electric field intensity detector upon input of the detection signal into the turn-on controller after the electric field intensity detector has been turned off by the turn-off controller.

8. The antenna tuning controller according to claim 1, wherein the controller controls the matching of the antenna side impedance with the radio section side impedance upon a determination that the amplified received signal is not intended to be received by turning off the electric field intensity detector.

9. The antenna tuning controller according to claim 1, wherein the controller controls the matching of the antenna side impedance with the radio section side impedance upon determining that the amplified received signal is not intended to be received by stopping the input of the electric field intensity signal to the antenna tuner upon determining that the amplified received signal is other than the intended signal to be received.

10. The antenna tuning controller according to claim 1, wherein the controller controls the matching of the antenna side impedance with the radio section side impedance in response to the evaluation of the electric field intensity signal by preventing the impedance matching upon determining that the received signal is not intended to be received by a particular receiver, and by executing the impedance matching upon determining that the received signal is intended to be received by the particular receiver.

11. An antenna tuning controller comprising:

an antenna for receiving a radio signal and outputting the received signal;

a radio section for amplifying the received signal;

an antenna tuner connected to the antenna and to the radio section and for matching the antenna side impedance with the radio section side impedance by varying the antenna tuner impedance according to an electric field intensity signal;

an electric field intensity detector for detecting the electric field intensity of the amplified received signal from the radio section and outputting the electric field intensity signal representing the detected electric field intensity; and a controller for determining whether the amplified received signal from the radio section is intended to be received by a particular receiver, and turning off the electric field intensity detector upon determining that the amplified received signal is not the intended to be received;

wherein the controller includes a demodulator for demodulating the amplified signal received from the radio section and outputting a resultant demodulation signal;

a sync signal detector for detecting, from the demodulation signal, a sync signal contained in the received signal, and outputting a detection signal in response to a detection thereof;

a turn-off controller for turning off the electric field intensity detector when no detection signal is outputted from the sync signal detector;

a first memory for storing a first predetermined value representing a threshold level above which indicates that the antenna side impedance and the radio section side impedance have been matched;

a second memory for storing a second predetermined value representing a threshold level above which indicates that the demodulator signal of the received signal may be decoded; and a commanding means for evaluating whether the electric field intensity represented by the electric field intensity signal is within a predetermined range by comparing the electric field intensity with the first predetermined value, comparing the electric field intensity represented by the electric field intensity signal with the second predetermined value when the electric field intensity represented by the electric field intensity signal is determined to be less than the first predetermined value, and commanding the sync signal detector to detect the sync signal from the demodulation signal when the electric field intensity represented by the electric field intensity signal is determined to be less than the first predetermined value but not less than the second predetermined value.

12. An antenna tuning controller comprising:

an antenna for receiving a radio signal and outputting the received signal;

a radio section for amplifying the received signal;

an antenna tuner connected to the antenna and to the radio section and for matching the antenna side impedance with the radio section side impedance by varying the antenna tuner impedance according to an electric field intensity signal;

an electric field intensity detector for detecting the electric field intensity of the amplified signal received from the radio section and outputting the electric field intensity signal representing the detected electric field intensity; and a controller for determining whether the amplified received signal from the radio section is intended to be received by a particular receiver, and turning off the electric field intensity detector upon determining that the amplified received signal is not intended to be received;

wherein the antenna tuner includes a variable capacitance capacitor (VCC) having a first VCC terminal connected to the antenna and a second VCC terminal connected to around;

a variable voltage capacitor (VVC) having a first VVC terminal connected to one of the first and second VCC terminals and a second VVC terminal connected to ground;

a capacitor (CP) having a first CP terminal connected to one of the first and second VVC terminals and a second CP terminal connected to the radio section; and a resistor (RS) having a first RS terminal connected to one of the first and second VVC terminals and a second RS terminal connected to the electric field intensity detector.

13. An antenna tuning controller comprising:

an antenna for receiving a radio signal and outputting the received signal;

a radio section for amplifying the received signal;

an antenna tuner connected to the antenna and to the radio section and for matching the antenna side impedance with the radio section side impedance by varying the antenna tuner impedance according to an electric field intensity signal;

an electric field intensity detector for detecting the electric field intensity of the amplified received signal from the radio section and outputting the electric field intensity signal representing the detected electric field intensity;

a controller for determining whether the amplified received signal from the radio section is intended to be received by a particular receiver, and turning off the electric field intensity detector upon determining that the amplified received signal is not intended to be received while allowing the radio section to remain on;

a timer for starting a time measurement when the electric field intensity detector is turned off by the controller and outputting a time-up signal when the time measurement reaches a predetermined time interval; and a turn-on controller for turning on the electric field intensity detector in response to the time-up signal.

* * * * *